(12) United States Patent
Kato et al.

(10) Patent No.: US 10,373,846 B2
(45) Date of Patent: Aug. 6, 2019

(54) SUBSTRATE PROCESSING METHOD (71) Applicant: Tokyo Electron Limited, Tokyo (JP)

(72) Inventors: Takahiko Kato, Miyagi (JP); Weiting Chen, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 45 days.

(21) Appl. No.: 15/609,371

(22) Filed: May 31, 2017

(65) Prior Publication Data

US 2017/0352560 A1 Dec. 7, 2017

(30) Foreign Application Priority Data

Jun. 1, 2016 (JP) ................... 2016-110055

(51) Int. Cl.
*H01L 21/67* (2006.01)
*H01J 37/32* (2006.01)
(Continued)

(52) U.S. Cl.
CPC .. *H01L 21/67069* (2013.01); *C23C 16/45525* (2013.01); *H01J 37/32082* (2013.01);
(Continued)

(58) Field of Classification Search
CPC .......... C23C 16/45525; H01J 2237/334; H01J 37/32091; H01J 37/3244; H01J 37/32642; H01J 37/32724; H01J 37/32834; H01J 37/32802; H01L 21/6833; H01L 21/67069; H01L 21/67017; H01L 21/02274; H01L 21/31116
(Continued)

(56) References Cited

U.S. PATENT DOCUMENTS

| 8,625,068 B2* | 1/2014 | Nienhuys | G03F 7/70233 355/30 |
| 2016/0035566 A1* | 2/2016 | LaVoie | C23C 16/45565 438/778 |
| 2016/0056021 A1* | 2/2016 | Tsujimoto | H01J 37/32091 438/710 |

FOREIGN PATENT DOCUMENTS

| JP | 09-027396 A | 1/1997 |
| JP | 5014435 B2 | 6/2012 |

(Continued)

*Primary Examiner* — Lan Vinh
(74) *Attorney, Agent, or Firm* — Pearne & Gordon LLP (57) ABSTRACT

A substrate processing method includes a first process of supplying a first gas to a substrate; and a second process of supplying a second gas to the substrate after the first process. When a distance from an edge of the substrate to a boundary between a processing space and a gas exhaust space is L, a cross sectional area of a space orthogonal to a flow of the second gas is S(x), a supply flow rate of the second gas is Q, a pressure within the processing space is P and a diffusion coefficient of the first gas to the second gas is D, at least one of the distance L, the cross sectional area S(x) and the supply flow rate Q in the second process is adjusted such that a Peclet number Pe calculated by expression (3) becomes larger than 1.

[Expression 3]

$$Pe = \frac{Q}{D \cdot P} \int_0^L \frac{1}{S_{(x)}} dx \quad (3)$$

20 Claims, 7 Drawing Sheets (51) Int. Cl.
*C23C 16/455* (2006.01)
*H01L 21/02* (2006.01)
*H01L 21/311* (2006.01)
*H01L 21/683* (2006.01)

(52) U.S. Cl.
CPC .. *H01J 37/32834* (2013.01); *H01L 21/02274* (2013.01); *H01L 21/31116* (2013.01); *H01L 21/67017* (2013.01); *H01L 21/6833* (2013.01); *H01J 37/3244* (2013.01); *H01J 37/32091* (2013.01); *H01J 37/32642* (2013.01); *H01J 37/32724* (2013.01); *H01J 2237/334* (2013.01)

(58) Field of Classification Search
USPC ..... 438/706, 710, 712, 714, 14; 156/345.33, 156/345.34, 345.51
See application file for complete search history.

(56) References Cited

FOREIGN PATENT DOCUMENTS

| | | |
|---|---|---|
| JP | 2015-173240 A | 10/2015 |
| WO | 2008/061069 A | 5/2008 |

* cited by examiner

SUBSTRATE PROCESSING METHOD

CROSS-REFERENCE TO RELATED APPLICATION

This application claims the benefit of Japanese Patent Application No. 2016-110055 filed on Jun. 1, 2016, the entire disclosures of which are incorporated herein by reference.

TECHNICAL FIELD

The embodiments described herein pertain generally to a substrate processing method.

BACKGROUND

There is known a method of forming a preset film on a substrate by an atomic layer deposition method or a method of etching a film formed on the substrate by an atomic layer etching method (see, for example, Patent Documents 1 and 2). In these methods, the preset film is formed on the substrate or the film formed on the substrate is etched by supplying different kinds of gases to the substrate within a processing vessel in sequence.

Further, there is also known an etching method (an etching method using continuous plasma) in which a processing condition is switched from a gas condition of one etching process to a gas condition of another etching process while maintaining plasma, in order to shorten an etching time when etching an etching target film having several kinds of insulating films stacked on top of each other, for example (See, for example, Patent Document 3).

Patent Document 1: Japanese Patent Laid-open Publication No. H09-027396
Patent Document 2: Japanese Patent Laid-open Publication No. 2015-173240
Patent Document 3: Japanese Patent Publication No. 5,014,435

In the aforementioned methods, however, a part of a gas, which is once exhausted from a region where the substrate is provided within the processing vessel to a downstream side region thereof, may flow back into the region where the substrate is provided within the processing vessel. If such a backflow of the gas occurs, a time of replacing the gas is lengthened when changing the gas. Further, since a next process may be performed in a state that the gas is not sufficiently replaced, the process may be unstably performed.

SUMMARY

In view of the foregoing, exemplary embodiments provide a substrate processing method capable of shortening a time required to replace a gas.

In one exemplary embodiment, there is provided a substrate processing method performed in a substrate processing apparatus having, within a processing vessel, a processing space in which a preset processing is performed by supplying a gas to a substrate; and a gas exhaust space communicating with the processing space and having a pressure lower than a pressure of the processing space by a preset ratio. The substrate processing method includes a first process of supplying a first gas to the substrate; and a second process of supplying a second gas different from the first gas to the substrate after the first process. When a distance from an edge of the substrate to a boundary between the processing space and the gas exhaust space is L, a cross sectional area of a space orthogonal to a flow of the second gas is S(x), a supply flow rate of the second gas is Q a pressure within the processing space is P and a diffusion coefficient of the first gas with respect to the second gas is D, at least one of the distance L from the edge of the substrate to the boundary between the processing space and the gas exhaust space, the cross sectional area S(x) of the space orthogonal to the flow of the second gas and the supply flow rate Q of the second gas in the second process is adjusted such that a Peclet number Pe calculated by an expression (3) becomes larger than 1.

[Expression 3]

$$Pe = \frac{Q}{D \cdot P} \int_0^L \frac{1}{S_{(x)}} dx \qquad (3)$$

According to the exemplary embodiment, it is possible to shorten a time required to replace the gas.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment will be explained in detail with reference to the accompanying drawings. In the specification and the drawings, like parts having substantially the same function and configuration will be assigned like reference numerals, and redundant description will be omitted.

A substrate processing method according to an exemplary embodiment includes a first process of supplying a first gas onto a substrate and a second process of supplying a second gas different from the first gas onto the substrate. In this method, a predetermined processing condition is adjusted such that a Peclet number Pe in the second process becomes larger than 1. The Peclet number Pe will be explained later. This substrate processing method according to the exemplary embodiment is applicable to a substrate processing apparatus configured to perform a preset processing such as a film forming processing or an etching processing on a substrate.

In the following, description will be provided for an example case where the substrate processing method according to the exemplary embodiment is applied to a plasma processing apparatus as an example of the substrate processing apparatus.

(Plasma Processing Apparatus)

Figure 1:
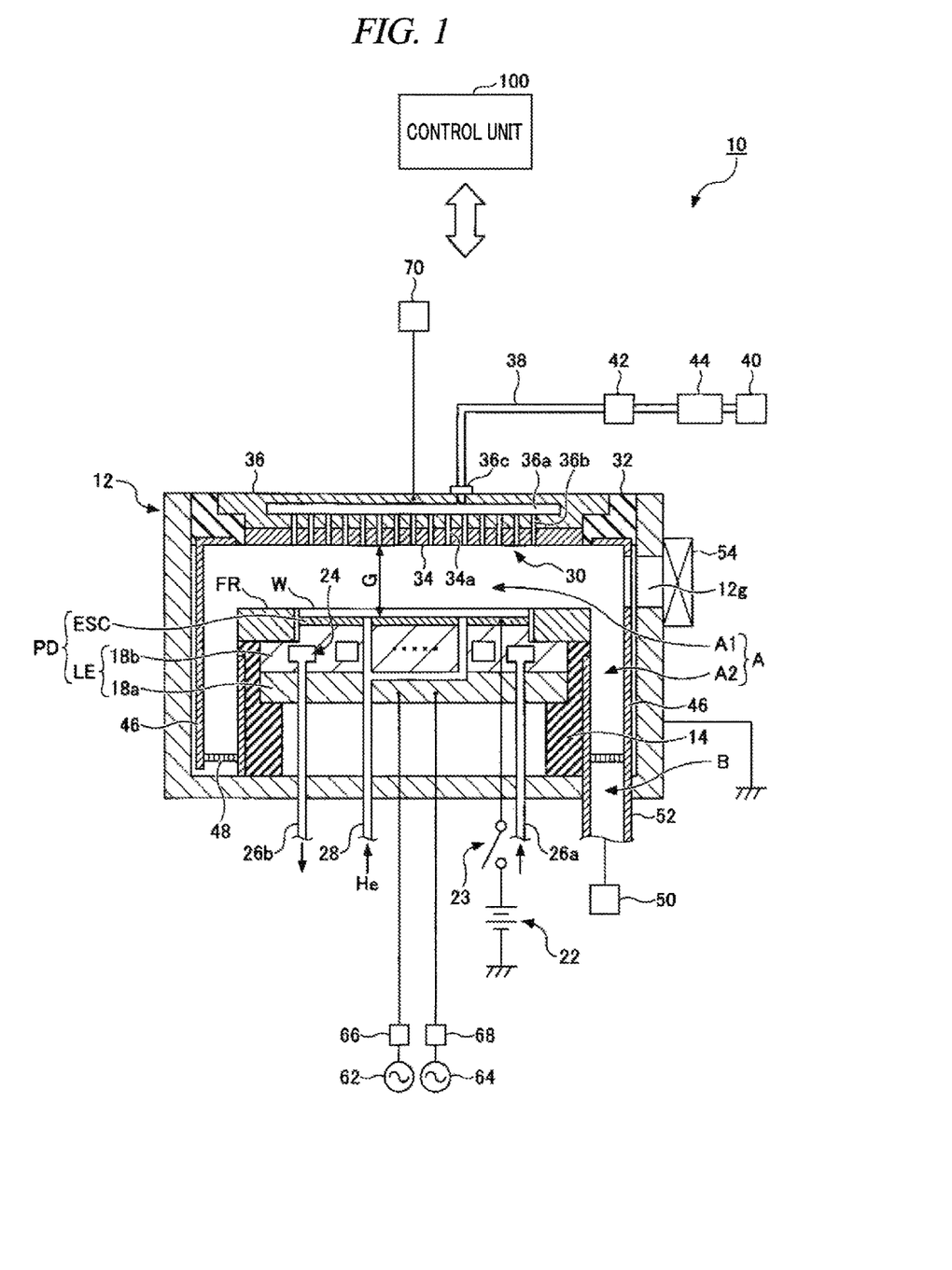
FIG. 1 is a schematic configuration view illustrating a plasma processing apparatus according to an exemplary embodiment.

A plasma processing apparatus according to an exemplary embodiment will be discussed. FIG. 1 is a schematic configuration view illustrating the plasma processing apparatus according to the exemplary embodiment.

As shown in FIG. 1, the plasma processing apparatus 10 is configured as a capacitively coupled plasma etching apparatus and is equipped with a substantially cylindrical processing vessel 12. An inner wall surface of the processing vessel 12 is made of, by way of non-limiting example, anodically oxidized aluminium. The processing vessel 12 is grounded.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. Further, a mounting table PD is provided within the processing vessel 12. The mounting table PD is supported by the supporting member 14.

The mounting table PD is configured to hold the wafer W on a top surface thereof. The mounting table PD includes a lower electrode LE and an electrostatic chuck ESC. The lower electrode LE is provided with a first plate 18a and a second plate 18b. The first plate 18a and the second plate 18b are made of a metal such as, but not limited to, aluminum and have a substantially disk shape. The second plate 18b is provided on the first plate 18a and electrically connected with the first plate 18a.

The electrostatic chuck ESC is provided on the second plate 18b. The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 serving as a temperature controller is provided within the second plate 18b. A coolant is supplied into the coolant path 24 from a chiller unit provided outside the processing vessel 12 via a pipeline 26a. The coolant supplied into the coolant path 24 is then returned back into the chiller unit via a pipeline 26b. That is, the coolant is supplied to circulate through the coolant path 24. A temperature of the wafer W held by the electrostatic chuck ESC is controlled by adjusting a temperature of the coolant which is supplied into the coolant path 24.

Furthermore, the plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other. Formed between the upper electrode 30 and the lower electrode LE is a processing space A in which a plasma processing is performed on the wafer W.

The upper electrode 30 is supported at an upper portion of the processing vessel 12 with an insulating shield member 32 therebetween. For example, the upper electrode 30 is configured such that a distance G from the top surface of the mounting table PD thereto is variable in a vertical direction. The upper electrode 30 includes an electrode plate 34 and an electrode supporting body 36. The electrode plate 34 directly faces the processing space A, and is provided with a multiple number of gas discharge holes 34a. The electrode plate 34 is made of, by way of non-limiting example, silicon. Further, though the electrode plate 34 shown in FIG. 1 has a flat plate shape, the electrode plate 34 may have a tapered shape in which the distance G between the upper electrode 30 and the top surface of the mounting table PD is shortened toward the outer periphery thereof.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. Multiple gas through holes 36b are extended downwards from the gas diffusion space 36a, and these gas through holes 36b communicate with the gas discharge holes 34a, respectively. Further, the electrode supporting body 36 is also provided with a gas inlet opening 36c through which a processing gas is introduced into the gas diffusion space 36a, and this gas inlet opening 36c is connected to a gas supply line 38.

A gas supply source group 40 is connected to the gas supply line 38 via a valve group 42 and a flow rate controller group 44. The gas supply source group 40 includes a plurality of gas supply sources such as a supply source of a processing gas, a supply source of a purge gas, or a supply source of an oxygen (O₂) gas. The processing gas may be a fluorocarbon gas containing at least one of, by way of example, but not limitation, a $C_4F_6$ gas and a $C_4F_8$ gas. Further, the purge gas is a rare gas containing at least one of an argon (Ar) gas, a He gas, a krypton (kr) gas and a xenon (Xe) gas.

The valve group 42 includes a multiple number of valves, and the flow rate controller group 44 includes a multiple number of flow rate controllers such as mass flow controllers. Each of the gas supply sources belonging to the gas supply source group 40 is connected to the gas supply line 38 via each corresponding valve belonging to the valve group 42 and each corresponding flow rate controller belonging to the flow rate controller group 44.

In the plasma processing apparatus 10, a deposition shield 46 is detachably provided along the inner wall of the processing vessel 12. The deposition shield 46 is also provided on an outer side surface of the supporting member 14. The deposition shield 46 is configured to suppress an etching byproduct from adhering to the processing vessel 12, and is formed of an aluminum member coated with ceramics such as $Y_2O_3$.

A baffle plate 48 having a multiple number of gas exhaust holes is provided around the mounting table PD to evacuate the inside of the processing vessel 12 uniformly. The baffle plate 48 is made of, by way of non-limiting example, aluminum coated with ceramics such as $Y_2O_3$. A gas exhaust space B is provided under the baffle plate 48 to surround the mounting table PD. That is, the gas exhaust space B communicates with the processing space A via the baffle plate 48. Further, the baffle plate 48 may be configured to be movable in a vertical direction around the mounting table PD.

The processing space A is connected with a gas exhaust device 50 including a vacuum pump such as a turbo molecular pump via a gas exhaust line 52 from the gas exhaust space B. A gas in the processing space A within the processing vessel 12 is discharged into the gas exhaust space B and is exhausted through the gas exhaust line 52 by the gas exhaust device 50. Accordingly, the processing space A within the processing vessel 12 can be decompressed to a preset vacuum level. Further, since a conductance in a portion where the baffle plate 48 is provided is low, the gas exhaust space B has a pressure smaller than a pressure of the processing space A by a preset ratio. The preset ratio varies depending on the number and the size of the gas exhaust holes provided in the baffle plate 48. For example, the preset ratio may be set to be equal to or higher than 30%.

The plasma processing apparatus 10 further includes a first high frequency power supply 62 and a second high frequency power supply 64. The first high frequency power supply 62 is configured to generate a first high frequency power for plasma generation having a frequency ranging from 27 MHz to 100 MHz, for example, 40 MHz. The first high frequency power supply 62 is connected to the lower electrode LE via a matching device 66. The matching device 66 is a circuit configured to match an output impedance of the first high frequency power supply 62 and an input impedance at a load side (lower electrode LE side). The first high frequency power supply 62 may be connected to the upper electrode 30 via the matching device 66.

The second high frequency power supply 64 is configured to generate a second high frequency bias power for ion attraction into the wafer W having a frequency ranging from 400 kHz to 13.56 MHz, for example, 13 MHz. The second high frequency power supply 64 is connected to the lower electrode LE via a matching device 68. The matching device 68 is a circuit configured to match an output impedance of the second high frequency power supply 64 and the input impedance at the load side (lower electrode LE side).

Further, the plasma processing apparatus 10 further includes a power supply 70. The power supply 70 is connected to the upper electrode 30. The power supply 70 is configured to apply, to the upper electrode 30, a voltage for attracting positive ions within the processing space A onto the electrode plate 34. As an example, the power supply 70 is a DC power supply configured to generate a negative DC voltage. As another example, the power supply 70 may be an AC power supply configured to generate an AC voltage of a relatively low frequency. The voltage applied from the power supply 70 to the upper electrode may be equal to or higher than, for example, 150 V. If such a voltage is applied to the upper electrode 30 from the power supply 70, the positive ions existing in the processing space A collide with the electrode plate 34. As a result, secondary electrons and/or silicon are released from the electrode plate 34. The released silicon combine with active species of fluorine which exist within the processing space A to reduce the amount of the active species of the fluorine.

Further, in the exemplary embodiment, the plasma processing apparatus 10 may further include a control unit 100. The control unit 100 is implemented by a computer including a processor, a storage unit, an input device, a display device, and so forth, and is configured to control individual components of the plasma processing apparatus 10. In the control unit 100, an operator can input commands through the input device to manage the plasma processing apparatus 10, and an operational status of the plasma processing apparatus 10 can be visually displayed on the display device. Further, the storage unit of the control unit 100 stores therein a control program for controlling various processings performed in the plasma processing apparatus 10 by the processor, or a program for allowing each component of the plasma processing apparatus 10 to perform a processing according to processing conditions, i.e., a processing recipe.

(Substrate Processing Method)

Now, a substrate processing method according to the exemplary embodiment will be explained. Hereinafter, substrate processing methods according to a first exemplary embodiment and a second exemplary embodiment capable of shortening a time required to replace a gas will be explained for an example case of etching a silicon oxide film formed on a wafer by using the above-described plasma processing apparatus. The substrate processing methods to be described below are performed as the individual components of the plasma processing apparatus 10 are controlled by the control unit 100.

First Exemplary Embodiment

Figure 2:
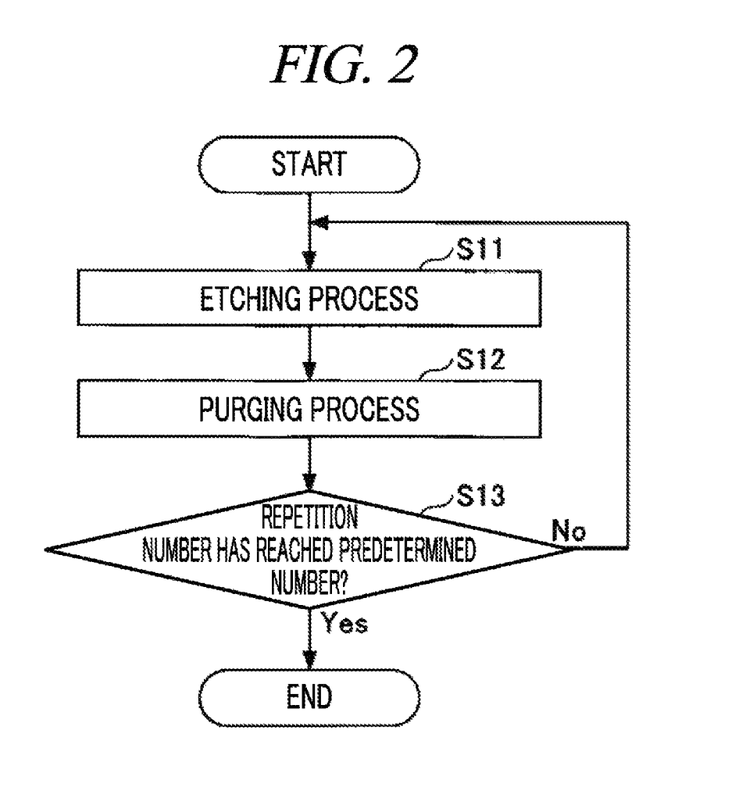
FIG. 2 is a flowchart for describing a substrate processing method according to a first exemplary embodiment.

A substrate processing method according to the first exemplary embodiment will be described. FIG. 2 is a flowchart for describing the substrate processing method according to the first exemplary embodiment.

As depicted in FIG. 2, the substrate processing method according to the first exemplary embodiment includes an etching process S11 and a purging process 12. The etching process S11 and the purging process S12 are repeated a predetermined number of times. That is, after the purging process S12, a determination process S13 of determining whether the number of the repetitions has reached a predetermined number is performed. If the number of the repetitions is found to reach the predetermined number, the processing is ended, whereas if it is determined that the number of the repetitions has not reached the predetermined number, the processing returns back to the etching process S11. Here, the predetermined number may be one or more.

In the etching process S11, a processing gas containing a fluorocarbon gas and a rare gas is supplied to a wafer W after being plasmarized. In the etching process S11, plasma is generated as the processing gas is excited, and the wafer W is exposed to the generated plasma. As a result, a silicon oxide film formed on the wafer W is etched. Further, in the etching process S11, a deposit containing the fluorocarbon gas is deposited on the silicon oxide film. For example, the fluorocarbon gas contains at least one of a $C_4F_6$ gas and a $C_4F_8$ gas. The rare gas contains at least one of an Ar gas, a He gas, a Kr gas and a Xe gas, for example.

To elaborate, the processing gas is supplied into the processing vessel 12 from the gas supply source group 40, and the high frequency powers from the first high frequency power supply 62 and the second high frequency power supply 64 are supplied to the lower electrode LE. Further, a pressure in the processing space A within the processing vessel 12 is adjusted to a preset pressure by the gas exhaust device 50. Further, the distance G between the upper electrode 30 and the top surface of the mounting table PD is adjusted to a preset distance. As a result, the plasma of the processing gas is generated in the processing space A within the processing vessel 12, and the wafer W placed on the mounting table PD is exposed to the plasma. Further, in the etching process S11, the voltage from the power supply 70 may be applied to the upper electrode 30.

In the purging process S12, a purge gas is supplied to the wafer W. Accordingly, the processing gas, which is supplied into the processing vessel 12 in the etching process S11 and remains in the processing space A, is replaced with the purge gas. For example, the purge gas may be the same as or different from the rare gas used in the etching process S11.

To elaborate, while supplying the purge gas into the processing vessel 12 from the gas supply source group 40, the processing gas remaining in the processing space A within the processing vessel 12 is exhausted along with the purge gas by the gas exhaust device 50. Accordingly, the processing gas, which is supplied into the processing vessel 12 in the etching process S11 and remains in the processing space A, is exhausted, and the gas within the processing space A is replaced with the purge gas.

Further, in the purging process S12, by stopping a supply of the gas other than the rare gas contained in the processing gas supplied into the processing vessel 12 in the etching process S11, the rare gas may be supplied into the processing vessel 12. That is, when switching from the etching process S11 to the purging process S12, the supply of the rare gas may not be stopped, and the rare gas may be continuously supplied into the processing vessel 12. In this case, a flow rate of the rare gas may be the same as or different from a flow rate of the rare gas supplied into the processing vessel 12 in the etching process S11.

Figure 3:
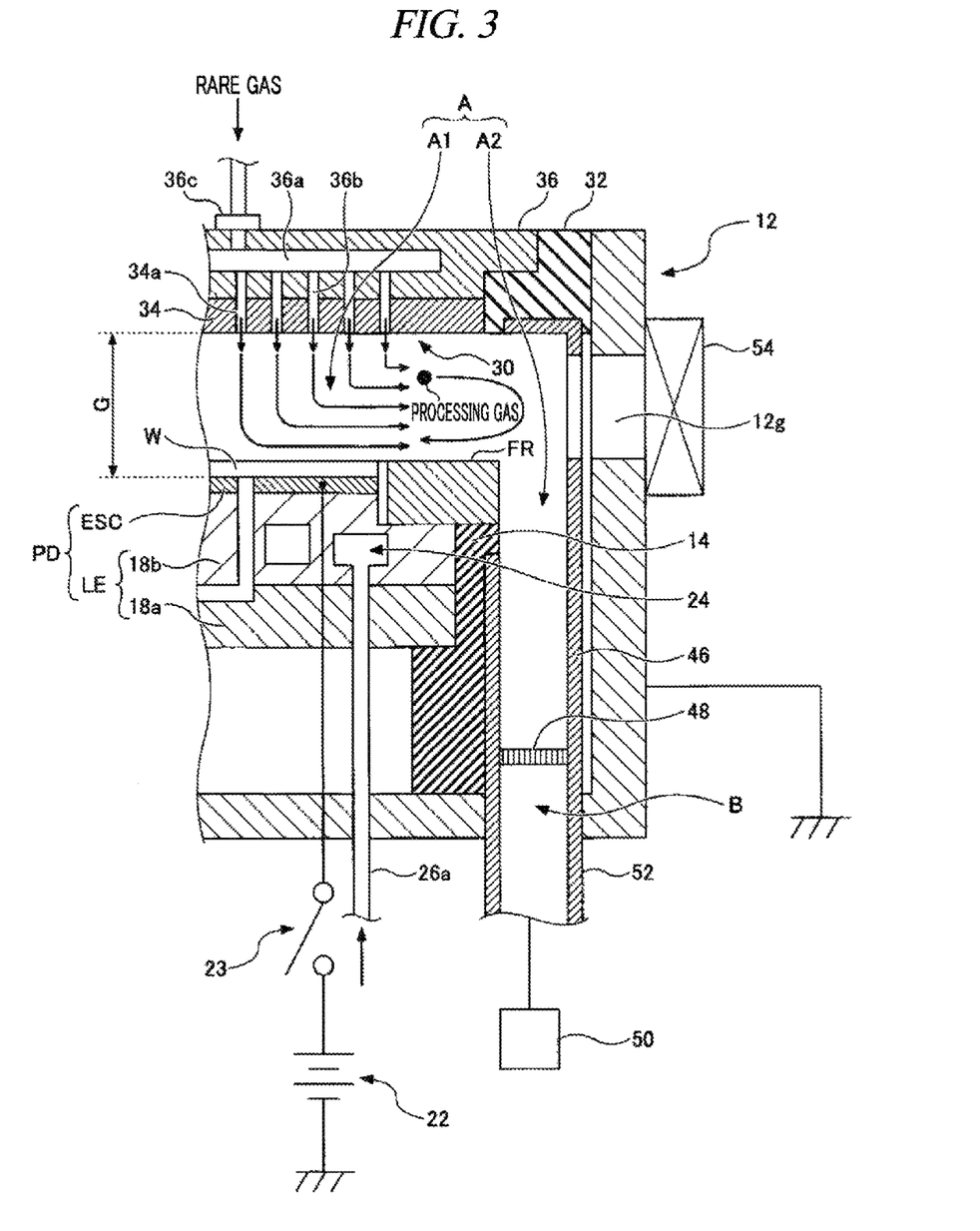
FIG. 3 is a diagram for describing a flow of a gas.

At this time, as illustrated in FIG. 3, a part of the processing gas, which is once exhausted into a region (hereinafter, referred to as "region A2") of the processing space A at the side of the gas exhaust space B from a region (hereinafter, referred to as "region A1") of the processing space A where the wafer W is provided, may flow back into the region A1. If such a backflow of the processing gas occurs, a time required to replace the processing gas remaining in the region A1 with the purge gas is lengthened. As a result, a time required to etch the silicon oxide film formed on the wafer W in a preset amount is also increased. FIG. 3 is a diagram for describing a flow of the gas.

To solve this problem, according to the present exemplary embodiment, the etching process S11 of supplying the processing gas to the wafer W and the purging process S12 of supplying the purge gas to the wafer W are performed, and a predetermined processing condition is adjusted such that the Peclet number Pe in the purging process S12 becomes larger than 1.

The Peclet number Pe will be explained. If the gas is supplied from the multiple number of gas discharge holes 34a into the space between the upper electrode 30 and the mounting table PD, the gas flows in a gas exhaust direction (toward a portion where the gas exhaust device 50 is connected) while being diffused. Dependency of a concentration distribution of a gas component (for example, radicals) transported by "diffusion" and "flow" upon which one of the factors of the "diffusion" and the "flow" differs depending on the configuration of the apparatus, processing conditions, and so forth. As a dimensionless number which indicates how much the concentration distribution depends on which one of the factors of the "diffusion" and the "flow" qualitatively, there is known the Peclet number Pe.

Between x=0 and x=L (x denotes a length (m)), the Peclet number Pe is defined as the following expression (1) by using a flow velocity u (m/s) of the gas and a diffusion coefficient D (m²/s) of the first gas with respect to the second gas.

[Expression 1]

$$Pe = \frac{1}{D} \cdot \int_0^L u_{(x)} dx \quad (1)$$

Further, the flow velocity u of the gas is represented as the following expression (2) by using a supply flow rate Q (Torr·m³/s) of the gas, a cross sectional area S(x) (m²) of a space orthogonal to a flow of the gas and a pressure P (Torr) in the processing space A.

[Expression 2]

$$u(x) = \frac{Q}{P \cdot S(x)} \quad (2)$$

Further, the Peclet number Pe is represented as the following expression (3) by using the expressions (1) and (2).

[Expression 3]

$$Pe = \frac{Q}{D \cdot P} \int_0^L \frac{1}{S_{(x)}} dx \quad (3)$$

If the Peclet number Pe is smaller than 1, it is deemed that the gas transportation by "diffusion" is dominant. If the Paclet number Pe is larger than 1, on the other hand, it is deemed that the gas transportation by "flow" is dominant.

Figure 4:
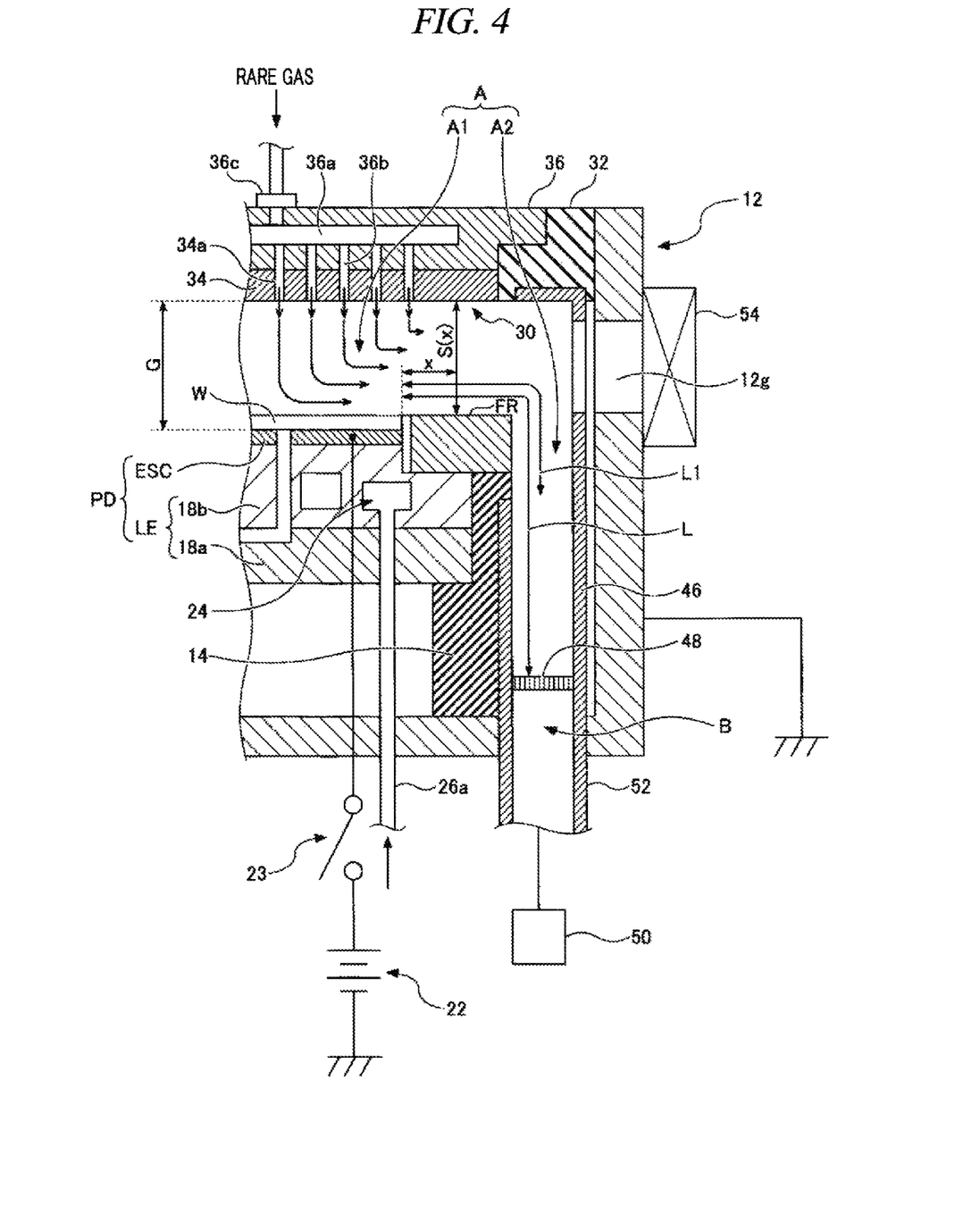
FIG. 4 is a diagram for describing a flow of a gas.

As shown in FIG. 4, assume that a distance from an edge of the wafer W to a boundary between the processing space A and the gas exhaust space B is L; a cross sectional area of the space orthogonal to the flow of the purge gas is S(x); a supply flow rate of the purge gas is Q; an internal pressure of the processing space A is P; and the diffusion coefficient of the processing gas with respect to the purge gas is D. In the present exemplary embodiment, the predetermined processing condition is adjusted such that the Peclet number Pe calculated by the aforementioned expression (3) becomes larger than 1. That is to say, as depicted in FIG. 4, if a distance from the edge of the wafer W in a direction toward the gas exhaust space B from the edge of the wafer W is set to be L1, the predetermined processing conditions are adjusted such that L1, which makes the Peclet number Pe of 1, is smaller than L. FIG. 4 is a diagram for describing the flow of the gas.

The predetermined processing condition is at least one of the distance L from the edge of the wafer W to the boundary between the processing space A and the gas exhaust space B, the cross sectional area $S(x)$ of the space orthogonal to the flow of the purge gas and the supply flow rate Q of the purge gas in the purging process S12. The distance L from the edge of the wafer W to the boundary between the processing space A and the gas exhaust space B may be adjusted by moving the baffle plate 48 in the vertical direction, for example. The cross sectional area $S(x)$ of the space orthogonal to the flow of the purge gas may be adjusted by controlling a shape of the processing vessel 12 for defining the $S(x)$, for example, while controlling the distance G between the upper electrode 30 and the top surface of the mounting table PD. The supply flow rate Q of the purge gas may be adjusted by controlling the flow rate controller of the flow rate controller group 44 corresponding to the purge gas, for example.

Accordingly, in the processing space A, the gas transportation by "flow" becomes more dominant than the gas transportation by "diffusion." Therefore, it is possible to suppress a part of the processing gas, which is once exhausted into the region A2 from the region A1, from flowing back into the region A1. Further, the processing gas that has reached the gas exhaust space B through the baffle plate 48 hardly flows back into the processing space A from the gas exhaust space B. It is because the gas exhaust space B has a pressure lower than that of the processing space A by a preset ratio. This preset ratio may be, e.g., 30% or higher.

Further, it is desirable that the predetermined processing condition is adjusted such that a sum of the distance L1 from the edge of the wafer W when the Peclet number Pe is 1 and a radius of the wafer W is smaller than a radius of the mounting table PD. Accordingly, it is possible to securely suppress a part of the processing gas, which is once exhausted into the region A2 from the region A1, from flowing back into the region A1.

As stated above, in the substrate processing method according to the first exemplary embodiment, the backflow of the gas from the gas exhaust space B into the processing space A can be suppressed, and the backflow of the gas from the region A2 into the region A1 can also be suppressed. Therefore, it is possible to shorten a time required to replace the processing gas remaining in the region A1 with the purge gas.

Second Exemplary Embodiment

Figure 5:
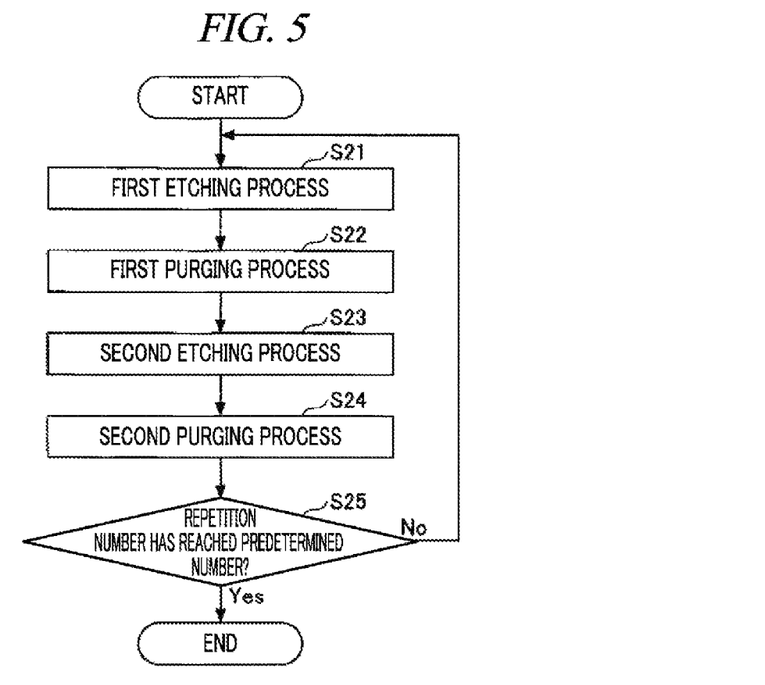
FIG. 5 is a flowchart for describing a substrate processing method according to a second exemplary embodiment.

A substrate processing method according to a second exemplary embodiment will be explained. FIG. 5 is a flowchart for describing the substrate processing method according to the second exemplary embodiment.

As depicted in FIG. 5, the substrate processing method according to the second exemplary embodiment includes a first etching process S21, a first purging process S22, a second etching process S23 and a second purging process S24. The first etching process S21, the first purging process S22, the second etching process S23 and the second purging process S24 are repeated a predetermined number of times. That is, after the second purging process S24, a determination process S25 of determining whether the number of the repetitions has reached the predetermined number is performed. If the number of the repetitions is found to reach the predetermined number, the processing is ended, whereas if it is determined that the number of the repetitions has not reached the predetermined number, the processing returns back to the first etching process S21. Here, the predetermined number may be one or more.

The first etching process S21 and the first purging process S22 may be the same as the etching process S11 and the purging process S12 of the first exemplary embodiment.

In the second etching process S23, a second processing gas containing an $O_2$ gas and a rare gas is supplied to the wafer W after being plasmarized. In the second etching process S23, plasma is generated as the second processing gas is excited, and the wafer W is exposed to the generated plasma. Accordingly, active species of rare gas atoms, for example, ions of the rare gas atoms collide with the deposit deposited in the first etching process S21. Accordingly, the etching is performed by radicals of fluorocarbon contained in the deposit, and the film thickness of the deposit is decreased. Here, the rare gas may be the same as or different from the rare gas used in the first etching process S21.

To elaborate, the second processing gas is supplied into the processing vessel 12 from the gas supply source group 40, and the high frequency powers from the first high frequency power supply 62 and the second high frequency power supply 64 are supplied to the lower electrode LE. Further, a pressure in the processing space A within the processing vessel 12 is adjusted to a preset pressure by the gas exhaust device 50. Further, the distance G between the upper electrode 30 and the top surface of the mounting table PD is adjusted to a preset distance. As a result, the plasma of the processing gas is generated in the processing space A within the processing vessel 12, and the wafer W placed on the mounting table PD is exposed to the plasma. Further, in the second etching process S23, the voltage from the power supply 70 may be applied to the upper electrode 30.

In the second purging process S24, a second purge gas is supplied to the wafer W. Accordingly, the second processing gas, which is supplied into the processing vessel 12 in the etching process S23 and remains in the processing space A, is replaced with the second purge gas. For example, the second purge gas may be the same as or different from the first purge gas.

To elaborate, while supplying the second purge gas into the processing vessel 12 from the gas supply source group 40, the second processing gas remaining in the processing space A within the processing vessel 12 is exhausted along with the second purge gas by the gas exhaust device 50. Accordingly, the second processing gas, which is supplied into the processing vessel 12 in the second etching process S23 and remains in the processing space A, is exhausted, and the gas within the processing space A is replaced with the purge gas.

In the preset exemplary embodiment, in the first purging process S22, a part of the first processing gas, which is once exhausted into the region A2 from the region A1, may flow back into the region A1. Further, in the second purging process S24, a part of the second processing gas, which is once exhausted into the region A2 from the region A1, may flow back into the region A1.

If such a backflow of the processing gas (the first processing gas or the second processing gas) occurs, a time required to replace the processing gas remaining in the region A1 with the purge gas is lengthened. As a result, a time required to etch the silicon oxide film formed on the wafer W in a preset amount is also increased.

To solve the problem, according to the second exemplary embodiment, a predetermined processing condition is adjusted such that the Peclet number Pe calculated by the aforementioned expression (3) becomes larger than 1 in the first purging process S22 and in the second purging process S24.

The predetermined processing condition in the first purging process S22 may be the same as the predetermined processing condition in the first exemplary embodiment.

In the second purging process S24, the predetermined processing condition may be at least one of the distance L from the edge of the wafer W to the boundary between the processing space A and the gas exhaust space B, a cross sectional area S(x) of a space orthogonal to a flow of the second purge gas and a supply flow rate Q of the second purge gas in the second purging process S24. The distance L from the edge of the wafer W to the boundary between the processing space A and the gas exhaust space B may be adjusted by moving the baffle plate 48 in the vertical direction, for example. The cross sectional area S(x) of the space orthogonal to the flow of the second purge gas may be adjusted by controlling, for example, the distance G between the upper electrode 30 and the top surface of the mounting table PD. The supply flow rate Q of the second purge gas may be adjusted by controlling the flow rate controller of the flow rate controller group 44 corresponding to the second purge gas, for example.

Accordingly, in the processing space A, the gas transportation by "flow" becomes more dominant than the gas transportation by "diffusion." Therefore, it is possible to suppress a part of the second processing gas, which is once exhausted into the region A2 from the region A1, from flowing back into the region A1. Further, the second processing gas that has reached the gas exhaust space B through the baffle plate 48 hardly flows back into the processing space A from the gas exhaust space B. It is because the gas exhaust space B has a pressure lower than that of the processing space A by a preset ratio. This preset ratio may be, e.g., equal to or higher than 30%.

As stated above, in the substrate processing method according to the second exemplary embodiment, the backflow of the gases from the gas exhaust space B into the processing space A can be suppressed, and the backflow of the gases from the region A2 into the region A1 can also be suppressed. Therefore, it is possible to shorten a time required to replace the first processing gas remaining in the region A1 with the first purge gas and a time required to replace the second processing gas remaining in the region A1 with the second purge gas.

Furthermore, in the second exemplary embodiment, the predetermined processing condition is adjusted such that the Peclet number Pe becomes larger than 1 in both the first purging process S22 and the second purging process S24. However, the present exemplary embodiment is not limited thereto. By way of example, the predetermined processing condition may be adjusted such that the Peclet number Pe becomes larger than 1 only in either one of the first purging process or the second purging process.

Third Exemplary Embodiment

Figure 6:
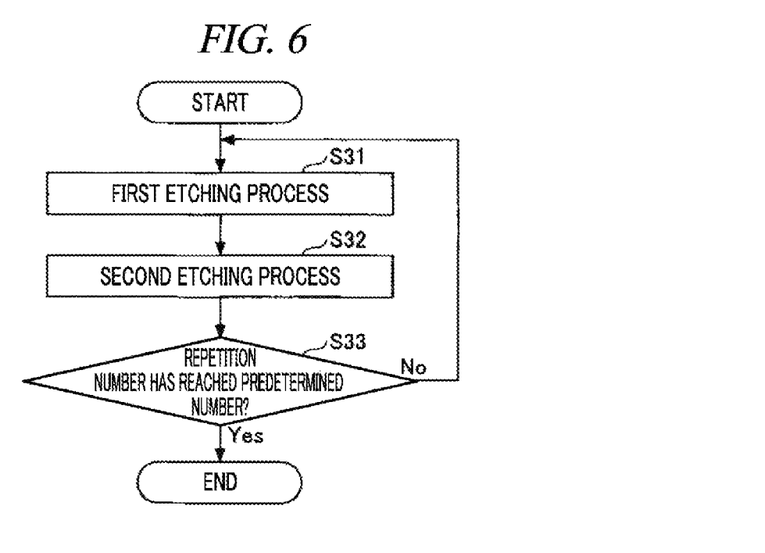
FIG. 6 is a flowchart for describing a substrate processing method according to a third exemplary embodiment.

Now, a substrate processing method according to a third exemplary embodiment will be explained. FIG. 6 is a flowchart for describing the substrate processing method according to the third exemplary embodiment and describes a substrate processing method using continuous plasma.

As depicted in FIG. 6, the substrate processing method according to the third exemplary embodiment is different from the substrate processing method of the second exemplary embodiment in that this method does not include the first purging process S22 and the second purging process S24. That is, in the substrate processing method according to the third exemplary embodiment includes a first etching process S31 and a second etching process S32. The first etching process S31 and the second etching process S32 are repeated a predetermined number of times. That is, after the second etching process S32, a determination process S33 of determining whether the number of repetitions has reached the predetermined number is performed. If the number of the repetitions is found to reach the predetermined number, the processing is ended, whereas if it is determined that the number of the repetitions has not reached the predetermined number, the processing returns back to the first etching process S31. Here, the predetermined number may be one or more.

In the third exemplary embodiment, in the second etching process S32, a predetermined processing condition is adjusted such that the Peclet number Pe calculated by the aforementioned expression (3) becomes larger than 1. Accordingly, a time required to replace a first processing gas remaining in the region A1 with a second processing gas can be shortened. Therefore, instability of the processing that might occur in a transition time during which the first etching process S31 is switched to the second etching process S32 can be removed.

Further, in the third exemplary embodiment, in the first etching process S31, the predetermined processing condition may be adjusted such that the Peclet number Pe calculated by the aforementioned expression (3) becomes larger than 1. Accordingly, a time required to replace the second processing gas remaining in the region A1 with the first processing gas can be shortened. Therefore, instability of the processing that might occur in a transition time during which the second etching process S32 is switched to the first etching process S31 can be removed.

(Simulation Result)

Now, a simulation result showing an effect of the exemplary embodiments will be explained.

In this simulation, it is investigated whether a flow of an $O_2$ gas remaining in the region A2 back into the region A1 is suppressed when a predetermined processing condition is adjusted such that the Peclet number Pe calculated by the aforementioned expression (3) becomes larger than 1 in the purging process.

FIG. 7A to FIG. 7D are diagrams showing an oxygen concentration in the processing space when the Peclet number Pe is changed. To elaborate, FIG. 7A to FIG. 7D present an oxygen concentration when an Ar gas is supplied into the region A1 and an $O_2$ gas is supplied into the region A2 under the condition that the distance G between the upper electrode 30 and the top surface of the mounting table PD is set to be 40 mm and the pressure in the processing space A is set to be 50 mTorr (6.7 Pa). Here, the $O_2$ gas is an example of the processing gas, and the Ar gas is an example of the purge gas. Furthermore, to create a similar state in which the $O_2$ gas remains in the region A2, the $O_2$ gas is supplied into the region A2.

Figure 7A:
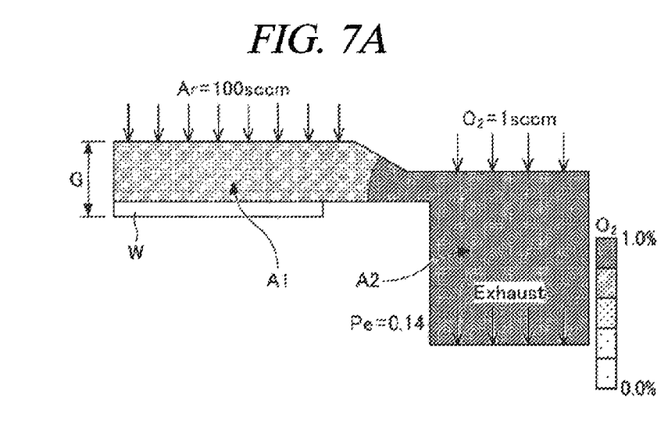
FIG. 7A to FIG. 7D are diagrams showing oxygen concentrations in a processing space when a Peclet number Pe is changed.
Figure 7B:
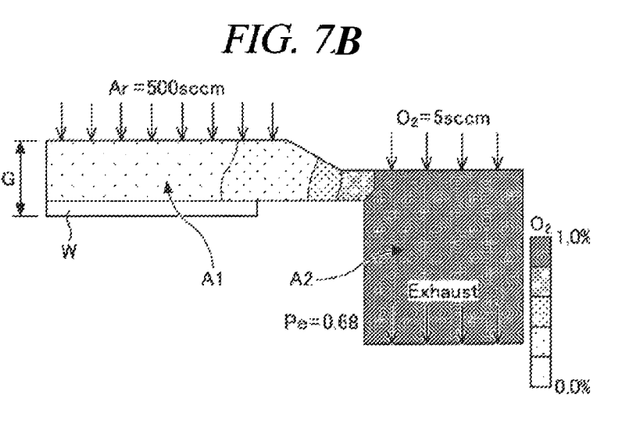
Figure 7C:
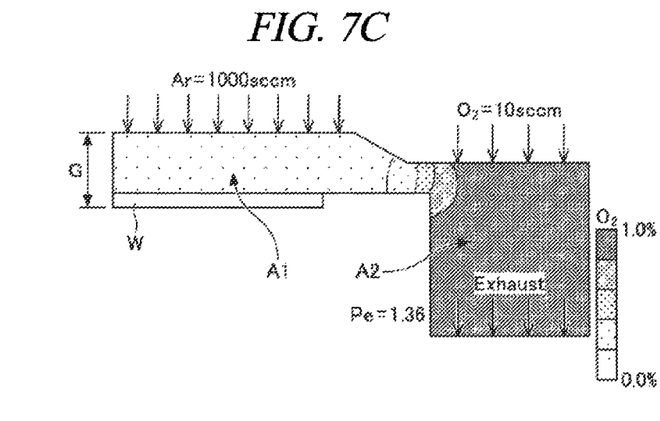
Figure 7D:
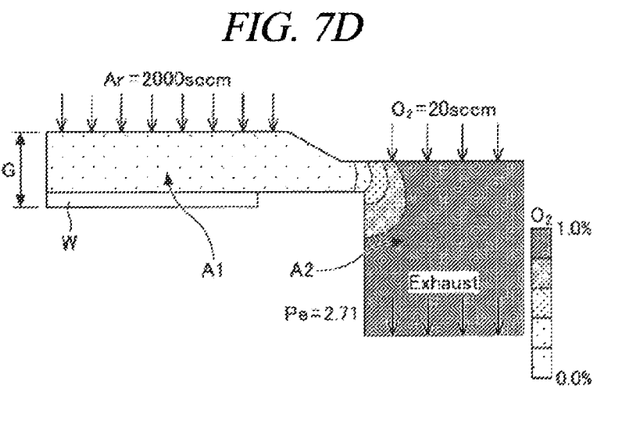

FIG. 7A shows a distribution of the oxygen concentration in the processing space A when the flow rate of the Ar gas is 100 sccm, the flow rate of the $O_2$ gas is 1 sccm and the Peclet number Pe is 0.14. FIG. 7B shows a distribution of the oxygen concentration in the processing space A when the flow rate of the Ar gas is 500 sccm, the flow rate of the $O_2$ gas is 5 sccm and the Peclet number Pe is 0.68. FIG. 7C shows a distribution of the oxygen concentration in the processing space A when the flow rate of the Ar gas is 1000 sccm, the flow rate of the $O_2$ gas is 10 sccm and the Peclet number Pe is 1.36. FIG. 7D shows a distribution of the oxygen concentration in the processing space A when the flow rate of the Ar gas is 2000 sccm, the flow rate of the $O_2$ gas is 20 sccm and the Peclet number Pe is 2.71. Further, the Peclet number Pe is a value calculated by the aforementioned expression (3).

As shown in FIG. 7C and FIG. 7D, if the Peclet number Pe is larger than 1, the concentration of the $O_2$ gas in the region A1 is small. That is, it is deemed that the $O_2$ gas hardly flows back into the region A1 from the region A2. As can be seen from this result, by adjusting the flow rate of the Ar gas supplied into the region A1 such that the Peclet number Pe becomes larger than 1, the backflow of the $O_2$ gas can be suppressed. As a consequence, a time required to replace the gas can be reduced.

In contrast, as depicted in FIG. 7A and FIG. 7B, if the Peclet number Pe is smaller than 1, the concentration of the $O_2$ gas in the region A1 increases as the region A2 becomes nearer. That is, it is deemed that the $O_2$ gas flows back into the region A1 from the region A2.

FIG. 8A to FIG. 8D are diagrams showing an oxygen concentration in the processing space when the Peclet number Pe is changed. To elaborate, FIG. 8A to FIG. 8D present an oxygen concentration when an Ar gas is supplied into the region A1 and an $O_2$ gas is supplied into the region A2 under the condition that the distance G between the upper electrode 30 and the top surface of the mounting table PD is set to be 90 mm and the pressure in the processing space A is set to be 50 mTorr (6.7 Pa). Here, the $O_2$ gas is an example of the processing gas, and the Ar gas is an example of the purge gas. Furthermore, to create a similar state in which the $O_2$ gas remains in the region A2, the $O_2$ gas is supplied into the region A2.

Figure 8A:
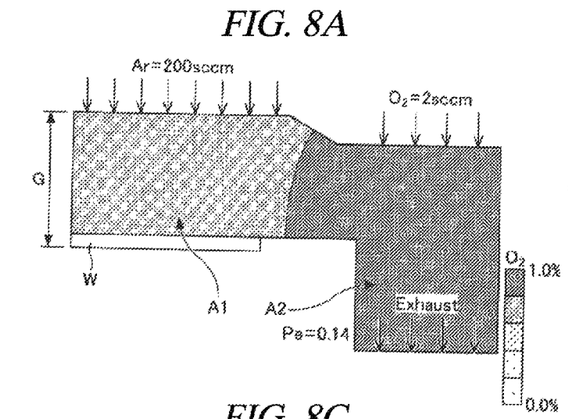
FIG. 8A to FIG. 8D are diagrams showing oxygen concentrations in the processing space when the Peclet number Pe is changed.
Figure 8B:
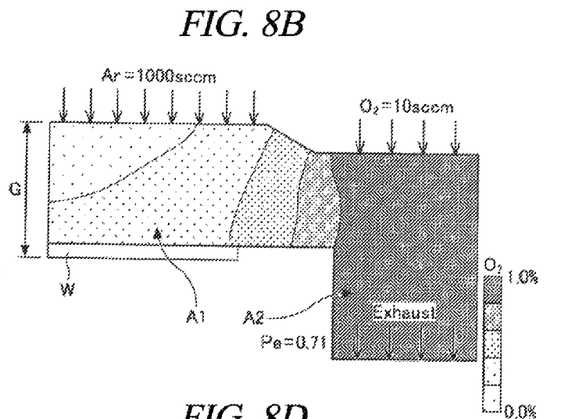
Figure 8C:
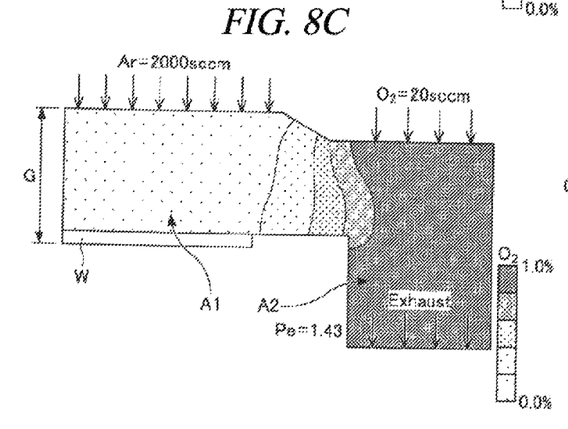
Figure 8D:
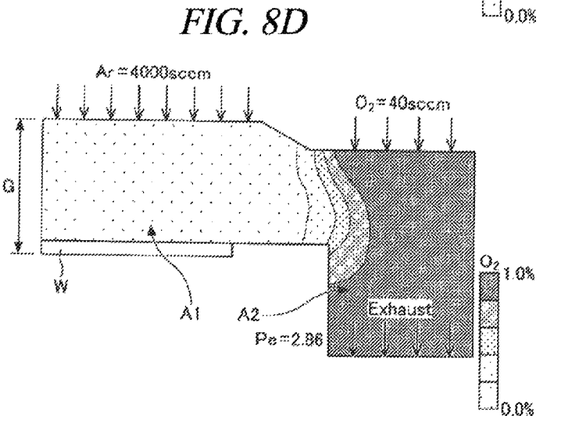

FIG. 8A shows a distribution of the oxygen concentration in the processing space A when the flow rate of the Ar gas is 200 sccm, the flow rate of the $O_2$ gas is 2 sccm and the Peclet number Pe is 0.14. FIG. 8B shows a distribution of the oxygen concentration in the processing space A when the flow rate of the Ar gas is 1000 sccm, the flow rate of the $O_2$ gas is 10 sccm and the Peclet number Pe is 0.71. FIG. 8C shows a distribution of the oxygen concentration in the processing space A when the flow rate of the Ar gas is 2000 sccm, the flow rate of the $O_2$ gas is 20 sccm and the Peclet number Pe is 1.43. FIG. 8D shows a distribution of the oxygen concentration in the processing space A when the flow rate of the Ar gas is 4000 sccm, the flow rate of the $O_2$ gas is 40 sccm and the Peclet number Pe is 2.86. Further, the Peclet number Pe is a value calculated by the aforementioned expression (3).

As shown in FIG. 8C and FIG. 8D, if the Peclet number Pe is larger than 1, the concentration of the $O_2$ gas in the region A1 is small. That is, it is deemed that the $O_2$ gas hardly flows back into the region A1 from the region A2. As can be seen from this result, by adjusting the flow rate of the Ar gas supplied into the region A1 such that the Peclet number Pe becomes larger than 1, the backflow of the $O_2$ gas can be suppressed. As a consequence, a time required to replace the gas can be reduced.

In contrast, as shown in FIG. 8A and FIG. 8B, if the Peclet number Pe is smaller than 1, the concentration of the $O_2$ gas in the region A1 increases as the region A2 becomes nearer. That is, it is deemed that the $O_2$ gas flows back into the region A1 from the region A2.

As stated above, by adjusting the flow rate of the Ar gas supplied into the region A1 and the distance G between the upper electrode 30 and the top surface of the mounting table PD such that the Peclet number Pe is larger than 1, the backflow of the $O_2$ gas can be suppressed. As a result, the time required to replace the $O_2$ gas with the Ar gas can be reduced.

Furthermore, in the above-described exemplary embodiments, the wafer W is an example of the substrate. The processing gas and the first processing gas are examples of the first gas; the purge gas and the first purge gas are examples of the second gas; the second processing gas is an example of a third gas; and the second purge gas is an example of a fourth gas. The etching process S11 and the first etching process S21 are examples of the first process, and the purging process S12 and the first purging process S22 are examples of the second process. The second etching process S23 is an example of a third process, and the second purging process S24 is an example of a fourth process.

The above-described exemplary embodiments are not limiting, and various changes and modifications may be made to the constituent components without departing from the scope of the present disclosure.

The above exemplary embodiments have been described for the case where the insulating film is etched by using the fluorocarbon gas as an etching gas. However, the exemplary embodiments are not limited thereto, and the etching gas may be selected depending on the kind of the etching target film formed on the wafer W. By way of example, but not limitation, a gas containing at least one of a fluoro-hydrocarbon gas, $NF_3$, $SF_6$, a rare gas, a nitrogen ($N_2$) gas, an $O_2$ gas, a hydrogen ($H_2$) gas, a bromine-containing gas, a chlorine-containing gas and an iodine-containing gas may be used as the etching gas.

In the above-described exemplary embodiments, the processing gas contains the rare gas such as the Ar gas. However, the exemplary embodiments are not limited thereto, and a gas containing at least one of the $N_2$ gas and the $O_2$ gas may be used as the processing gas.

The above exemplary embodiments have been described for the example in which the preset film formed on the wafer W is etched. However, the exemplary embodiments are not limited thereto. By way of example, a preset film may be formed on the wafer W. In case of forming the preset film on the wafer W, a film forming gas may be used as the processing gas instead of the etching gas. The film forming gas may be selected depending on the kind of the film to be formed on the wafer W. The film forming gas may be a gas containing at least one of, by way of example, but not limitation, a TEOS gas, a silylamine-based gas, a chlorosilane gas, a rare gas, an ammonia ($NH_3$) gas, a $N_2$ gas, an $O_2$ gas and a $H_2$ gas.

In the above-described exemplary embodiments, the rare gas such as the Ar gas is used as the purge gas. However, the exemplary embodiments are not limited thereto, and a gas containing at least one of the $N_2$ gas and the $O_2$ gas may be used as the purge gas.

In the above-described exemplary embodiments, the etching process and the purging process are repeated alternately. However, the exemplary embodiments are not limited thereto as long as different kinds of gases are supplied in sequence. By way of example, a film forming process, a purging process, an etching process and a purging process may be performed in sequence. In this case, the predetermined processing condition may be adjusted such that the Peclet number Pe becomes larger than 1 in the purging process after the film forming process or such that the Peclet number Pe becomes larger than 1 in the purging process after the etching process. Further, the predetermined processing condition may be adjusted such that the Peclet number Pe becomes larger than 1 both in the purging process after the film forming process and in the purging process after the etching process. Furthermore, the film forming process and the etching process may be repeated alternately. In this case, the predetermined processing condition may be adjusted such that the Peclet number Pe becomes larger than 1 in the etching process after the film forming process or in the film forming process after the etching process.

The above exemplary embodiments have been described for the example where the processing gas is supplied to the wafer W by being plasmarized. However, the exemplary embodiments are not limited thereto, and the processing gas may be supplied to the wafer W without being plasmarized.

In the above-described exemplary embodiments, the gas exhaust space B communicates with the processing space A via the baffle plate 48. However, the exemplary embodiments are not limited thereto, and the gas exhaust space B only needs to be a space communicating with the processing space A and having a pressure lower than the pressure of the processing space A by the preset ratio. For example, the gas exhaust space B may communicate with the processing space A via an APC (Automatic Pressure Control) valve as a variable butterfly valve instead of the baffle plate 48.

In the above-stated exemplary embodiments, the capacitively coupled plasma apparatus is used as the plasma processing apparatus. However, the exemplary embodiments are not limited thereto. By way of non-limiting example, an inductively coupled plasma apparatus, a microwave plasma apparatus may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method performed in a substrate processing apparatus having, within a processing vessel, a processing space in which a preset processing is performed by supplying a gas to a substrate; and a gas exhaust space communicating with the processing space and having a pressure lower than a pressure of the processing space by a preset ratio, the substrate processing method comprising:
   a first process of supplying a first gas to the substrate;
   a second process of supplying a second gas different from the first gas to the substrate after the first process; and
   when a distance from an edge of the substrate to a boundary between the processing space and the gas exhaust space is L, a cross sectional area of a space orthogonal to a flow of the second gas is S(x), a supply flow rate of the second gas is Q, a pressure within the processing space is P and a diffusion coefficient of the first gas with respect to the second gas is D, a process of adjusting at least one of the distance L, the cross sectional area S(x) and the supply flow rate Q in the second process such that a Peclet number Pe calculated by an expression (3) becomes larger than 1

[Expression 3]

$$Pe = \frac{Q}{D \cdot P} \int_0^L \frac{1}{S_{(x)}} dx \qquad (3)$$

2. The substrate processing method of claim 1,
   wherein the preset ratio is equal to or higher than 30%.
3. The substrate processing method of claim 1,
   wherein the first gas is supplied after being plasmarized in the first process.
4. The substrate processing method of claim 1,
   wherein the second gas is supplied after being plasmarized in the second process.
5. The substrate processing method of claim 1,
   wherein the substrate is placed on a mounting table, and
   when a distance from the edge of the substrate in a direction toward the gas exhaust space is L1 under a condition that the Peclet number Pe becomes 1, a sum of a radius of the substrate and the distance L1 is smaller than a radius of the mounting table.
6. The substrate processing method of claim 1,
   wherein the first process and the second process are performed repeatedly, and
   at least one of a distance L from the edge of the substrate to the boundary between the processing space and the gas exhaust space, a cross sectional area S(x) of a space orthogonal to a flow of the first gas and a supply flow rate Q of the first gas in the first process is adjusted such that the Peclet number Pe becomes larger than 1.
7. The substrate processing method of claim 1,
   wherein the first gas contains an etching gas, and the second gas contains at least one of a rare gas, an $O_2$ gas and a $N_2$ gas.
8. The substrate processing method of claim 7,
   wherein the first gas further contains at least one of a rare gas, an $O_2$ gas and a $N_2$ gas, and
   a flow rate of the at least one of the rare gas, the $O_2$ gas and the $N_2$ gas supplied to the substrate in the second process is equal to a flow rate of the at least one of the rare gas, the $O_2$ gas and the $N_2$ gas supplied to the substrate in the first process.
9. The substrate processing method of claim 1,
   wherein the first gas contains a film forming gas, and the second gas contains at least one of a rare gas, an $O_2$ gas and a $N_2$ gas.
10. The substrate processing method of claim 9,
    wherein the first gas further contains at least one of a rare gas, an $O_2$ gas and a $N_2$ gas, and
    a flow rate of the at least one of the rare gas, the $O_2$ gas and the $N_2$ gas supplied to the substrate in the second process is equal to a flow rate of the at least one of the rare gas, the $O_2$ gas and the $N_2$ gas supplied to the substrate in the first process.
11. A substrate processing method performed in a substrate processing apparatus having, within a processing vessel, a processing space in which a preset processing is performed by supplying a gas to a substrate; and a gas exhaust space communicating with the processing space and having a pressure lower than a pressure of the processing space by a preset ratio, the substrate processing method comprising:

a first process of supplying a first gas to the substrate; and a second process of supplying a second gas different from the first gas to the substrate after the first process, wherein, when a distance from an edge of the substrate to a boundary between the processing space and the gas exhaust space is L, a cross sectional area of a space orthogonal to a flow of the second gas is S(x), a supply flow rate of the second gas is Q, a pressure within the processing space is P and a diffusion coefficient of the first gas with respect to the second gas is D, at least one of the distance L from the edge of the substrate to the boundary between the processing space and the gas exhaust space, the cross sectional area S(x) of the space orthogonal to the flow of the second gas and the supply flow rate Q of the second gas in the second process is adjusted such that a Peclet number Pe calculated by an expression (3) becomes larger than 1

[Expression 3]

$$Pe = \frac{Q}{D \cdot P} \int_0^L \frac{1}{S_{(x)}} dx \qquad (3)$$

wherein the method further comprises:
a third process of supplying a third gas to the substrate after the second process; and
a fourth process of supplying a fourth gas different from the third gas to the substrate after the third process,
wherein at least one of a distance L from the edge of the substrate to the boundary between the processing space and the gas exhaust space, a cross sectional area S(x) of a space orthogonal to a flow of the fourth gas and a supply flow rate Q of the fourth gas in the fourth process is adjusted such that the Peclet number Pe becomes larger than 1.

12. The substrate processing method of claim 11, wherein the preset ratio is equal to or higher than 30%.

13. The substrate processing method of claim 11, wherein the first gas is supplied after being plasmarized in the first process.

14. The substrate processing method of claim 11, wherein the second gas is supplied after being plasmarized in the second process.

15. The substrate processing method of claim 11, wherein the substrate is placed on a mounting table, and
when a distance from the edge of the substrate in a direction toward the gas exhaust space is L1 under a condition that the Peclet number Pe becomes 1, a sum of a radius of the substrate and the distance L1 is smaller than a radius of the mounting table.

16. The substrate processing method of claim 11, wherein the first process and the second process are performed repeatedly, and
at least one of a distance L from the edge of the substrate to the boundary between the processing space and the gas exhaust space, a cross sectional area S(x) of a space orthogonal to a flow of the first gas and a supply flow rate Q of the first gas in the first process is adjusted such that the Peclet number Pe becomes larger than 1.

17. The substrate processing method of claim 11, wherein the first gas contains an etching gas, and the second gas contains at least one of a rare gas, an $O_2$ gas and a $N_2$ gas.

18. The substrate processing method of claim 17, wherein the first gas further contains at least one of a rare gas, an $O_2$ gas and a $N_2$ gas, and
a flow rate of the at least one of the rare gas, the $O_2$ gas and the $N_2$ gas supplied to the substrate in the second process is equal to a flow rate of the at least one of the rare gas, the $O_2$ gas and the $N_2$ gas supplied to the substrate in the first process.

19. The substrate processing method of claim 11, wherein the first gas contains a film forming gas, and the second gas contains at least one of a rare gas, an $O_2$ gas and a $N_2$ gas.

20. The substrate processing method of claim 19, wherein the first gas further contains at least one of a rare gas, an $O_2$ gas and a $N_2$ gas, and
a flow rate of the at least one of the rare gas, the $O_2$ gas and the $N_2$ gas supplied to the substrate in the second process is equal to a flow rate of the at least one of the rare gas, the $O_2$ gas and the $N_2$ gas supplied to the substrate in the first process.

* * * * *